United States Patent
Strohm, III (10) Patent No.: US 9,787,322 B2
(45) Date of Patent: *Oct. 10, 2017

(54) CONTENT COMPRESSION AND/OR DECOMPRESSION

(71) Applicant: Yahoo! Inc., Sunnyvale, CA (US)

(72) Inventor: Harry Jack Strohm, III, San Leandro, CA (US)

(73) Assignee: Yahoo Holdings, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/334,046

(22) Filed: Oct. 25, 2016

(65) Prior Publication Data

US 2017/0126246 A1 May 4, 2017

Related U.S. Application Data

(63) Continuation of application No. 14/926,541, filed on Oct. 29, 2015, now Pat. No. 9,496,893.

(51) Int. Cl.
*H03M 7/00* (2006.01)
*H03M 7/30* (2006.01)
*H03M 7/40* (2006.01)

(52) U.S. Cl.
CPC ........... *H03M 7/3059* (2013.01); *H03M 7/40* (2013.01)

(58) Field of Classification Search
CPC .............................. H03M 7/3059; H03M 7/40
USPC ............................................. 341/106, 50, 51
See application file for complete search history.

(56) References Cited

U.S. PATENT DOCUMENTS

| | | | | |
|---|---|---|---|---|
| 4,851,906 A | * | 7/1989 | Koga | ..................... H04N 19/94 348/413.1 |
| 4,868,570 A | * | 9/1989 | Davis | ..................... H03M 7/42 209/584 |
| 5,408,328 A | | 4/1995 | Boliek | |
| 7,656,320 B2 | | 2/2010 | Schneider | |
| 8,356,060 B2 | | 1/2013 | Marwah | |
| 8,418,167 B2 | | 4/2013 | Meller | |
| 9,496,893 B1 | | 11/2016 | Strohm | |

OTHER PUBLICATIONS

U.S. Appl. No. 14/926,541, filed Oct. 29, 2015, 67 pages.
U.S. Appl. No. 14/926,541, filed Nov. 10, 2015, 3 pages.
U.S. Appl. No. 14/926,541 / *Ex Parte Quayle* Action, Apr. 22, 2016, 4 pages.
U.S. Appl. No. 14/926,541 / Response after *Ex Parte Quayle* Action, Jun. 16, 2016, 4 pages.
U.S. Appl. No. 14/926,541 / Notice of Allowance and Fees, Jul. 18, 2016, 7 pages.
U.S. Appl. No. 14/926,541 / Issue Fee Payment and Amendments, Oct. 12, 2016, 8 pages.
U.S. Appl. No. 14/926,541 / Response to Amendment under Rule 312, Oct. 14, 2016, 2 pages.
U.S. Appl. No. 14/926,541 / Issue Notification, Oct. 26, 2016, 1 page.

\* cited by examiner

*Primary Examiner* — Jean B Jeanglaude
(74) *Attorney, Agent, or Firm* — Berkeley Law & Technology Group, LLP (57) ABSTRACT

Briefly, methods and/or systems of processing content entries are described. An example may comprise determining equivalent byte values of characters that form the content entries. The content entries may be transformed based, at least in part, on the equivalent byte values and compressed using, for example, delta compression.

20 Claims, 3 Drawing Sheets

CONTENT COMPRESSION AND/OR DECOMPRESSION

BACKGROUND

1. Field

The present disclosure relates generally to compressing and/or decompressing certain types of content.

2. Information

File compression may permit storage of files, such as computer files comprising alphanumeric text including, for example, names of individuals, part numbers, addresses, identification numbers, and/or other materials, in a manner that potentially reduces an amount of memory consumed compared to memory that would be consumed if compression were not employed. It is noted that throughout this document, the term "file" generically refers to storage as physical states in a memory (e.g., rather than to a specific type of storage format). Likewise, the term computer generically refers to a computing device, such as a desktop, laptop, tablet, cell phone, smart phone, PDA, etc., and the term computer memory generically refers to a memory for use in connection with a computing device, such as a desktop, laptop, tablet, cell phone, smart phone, PDA, etc. In some instances, lossless compression approaches may be utilized to compress files in a manner that reduces memory consumption without losing some content, for example. Responsive to decompression, computer files compressed via a lossless approach may be virtually identical to original, uncompressed computer files.

In other instances, computer files may be compressed utilizing a lossy approach, in which, for example, some content loss may be acceptable to a user. Lossy compression approaches may give rise, for example, to a capability for increased compression, compared to lossless compression approaches, as well as bringing about a reduction in processing resources utilized to compress and/or decompress computer files compared to lossless compression approaches, for example. However, although lossy compression approaches may, for example, comprise more computationally expedient processes in relation to processes that perform lossless compression, in some computing environments, typical lossy compression and/or decompression approaches may still consume more processing time than may be desirable.

BRIEF DESCRIPTION OF DRAWINGS

Claimed subject matter is particularly pointed and/or distinctly claimed in the concluding portion of the specification. However, both as to organization and/or method of operation, together with objects, claimed features, and/or advantages thereof, claimed subject matter may be understood by reference to the following detailed description if read with the accompanying drawings in which:

Reference is made in the following detailed description of the accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

With advances in technology, it has become more typical to employ distributed computing approaches in which portions of a problem, such as signal processing of signal samples, for example, may be allocated among computing devices, including one or more clients and/or one or more servers, via a computing and/or communications network, for example. A network may comprise two or more network devices and/or may couple network devices so that signal communications, such as in the form of signal packets and/or frames (e.g., comprising one or more signal samples), for example, may be exchanged, such as between a server and a client device and/or other types of devices, including between wireless devices coupled via a wireless network, for example.

An example of a distributed computing system comprises the Hadoop distributed computing system, which employs a map-reduce type of architecture. In this context, the terms map-reduce architecture and/or similar terms are intended to refer a distributed computing system implementation for processing and/or for generating large sets of signal samples employing a parallel, distributed process performed over a network of individual computing devices. A map operation and/or similar terms refer to processing of signals to generate one or more key-value pairs and to distribute the one or more pairs to the computing devices of the network. A reduce operation and/or similar terms refer to processing of signals via a summary operation (e.g., such as counting the number of students in a queue, yielding name frequencies). A system may employ such an architecture for processing by marshalling distributed servers, running various tasks in parallel, and managing communications and signal transfers between various parts of the system, in an embodiment.

(See, for example Jeffrey Dean et al. "Large Scale Distributed Neural Networks," Advances in Neural Information Processing Systems 25, 2012, pp 1232-1240.) As mentioned, one non-limiting, but well-known example comprises the Hadoop distributed computing system. It refers to an open source implementation of a map-reduce type architecture, but may include other aspects, such as the Hadoop distributed file system (HDFS). In general, therefore, Hadoop and/or similar terms refer to an implementation scheduler for executing large processing jobs using a map-reduce architecture.

In this context, the network device refers to any device capable of communicating via and/or as part of a network and may comprise a computing device. While network devices may be capable of sending and/or receiving signals (e.g., signal packets and/or frames), such as via a wired and/or wireless network, they may also be capable of performing arithmetic and/or logic operations, processing and/or storing signals (e.g., signal samples), such as in memory as physical memory states, and/or may, for example, operate as a server in various embodiments. Network devices capable of operating as a server, or otherwise, may include, as examples, dedicated rack-mounted servers, desktop computers, laptop computers, set top boxes, tablets, netbooks, smart phones, wearable devices, integrated devices combining two or more features of the foregoing devices, the like or any combination thereof. As mentioned, signal packets and/or frames, for example, may be exchanged, such as between a server and a client device and/or other types of network devices, including between wireless devices coupled via a wireless network, for example. It is noted that the terms, server, server device, server computing device, server computing platform and/or similar terms are used interchangeably. Similarly, the terms client, client device, client computing device, client computing platform and/or similar terms are also used interchangeably. While in some instances, for ease of description, these terms may be used in the singular, such as by referring to a "client device" or a "server device," the description is intended to encompass one or more client devices and/or one or more server devices, as appropriate. Along similar lines, references to a "database" are understood to mean, one or more databases and/or portions thereof, as appropriate.

It should be understood that for ease of description, a network device (also referred to as a networking device) may be embodied and/or described in terms of a computing device. However, it should further be understood that this description should in no way be construed that claimed subject matter is limited to one embodiment, such as a computing device and/or a network device, and, instead, may be embodied as a variety of devices or combinations thereof, including, for example, one or more illustrative examples.

Likewise, in this context, the terms "coupled," "connected," and/or similar terms are used generically. It should be understood that these terms are not intended as synonyms. Rather, "connected" is used generically to indicate that two or more components, for example, are in direct physical, including electrical, contact; while "coupled" is used generically to mean that two or more components are potentially in direct physical, including electrical, contact; however, "coupled" is also used generically to also mean that two or more components are not necessarily in direct contact, but nonetheless are able to co-operate and/or interact. The term "coupled" is also understood generically to mean indirectly connected, for example, in an appropriate context.

The terms "and," "or," "and/or," and/or similar terms, as used herein, include a variety of meanings that also are expected to depend at least in part upon the particular context in which such terms are used. Typically, "or" if used to associate a list, such as A, B, or C, is intended to mean A, B, and C, here used in the inclusive sense, as well as A, B, or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

A network may also include now known, and/or to be later developed arrangements, derivatives, and/or improvements, including, for example, past, present and/or future mass storage, such as network attached storage (NAS), a storage area network (SAN), and/or other forms of computing and/or device readable media, for example. A network may include a portion of the Internet, one or more local area networks (LANs), one or more wide area networks (WANs), wire-line type connections, wireless type connections, other connections, or any combination thereof. Thus, a network may be worldwide in scope and/or extent. Likewise, sub-networks, such as may employ differing architectures and/or may be substantially compliant and/or substantially compatible with differing protocols, such as computing and/or communication protocols (e.g., network protocols), may interoperate within a larger network. In this context, the term sub-network and/or similar terms, if used, for example, with respect to a network, refers to the network and/or a part thereof. Sub-networks may also comprise links, such as physical links, connecting and/or coupling nodes, such as to be capable to transmit signal packets and/or frames between devices of particular nodes, including wired links, wireless links, or combinations thereof. Various types of devices, such as network devices and/or computing devices, may be made available so that device interoperability is enabled and/or, in at least some instances, may be transparent to the devices. In this context, the term transparent refers to devices, such as network devices and/or computing devices, communicating via a network in which the devices are able to communicate via intermediate devices of a node, but without the communicating devices necessarily specifying one or more intermediate devices of one or more nodes and/or may include communicating as if intermediate devices of intermediate nodes are not necessarily involved in communication transmissions. For example, a router may provide a link and/or connection between otherwise separate and/or independent LANs. In this context, a private network refers to a particular, limited set of network devices able to communicate with other network devices in the particular, limited set, such as via signal packet and/or frame transmissions, for example, without a need for re-routing and/or redirecting transmissions. A private network may comprise a stand-alone network; however, a private network may also comprise a subset of a larger network, such as, for example, without limitation, all or a portion of the Internet. Thus, for example, a private network "in the cloud" may refer to a private network that comprises a subset of the Internet, for example. Although signal packet and/or frame transmissions may employ intermediate devices of intermediate nodes to exchange signal packet and/or frame transmissions, those intermediate devices may not necessarily be included in the private network by not being a source or destination for one or more signal packet and/or frame transmissions, for example. It is understood in this context that a private network may provide outgoing network communications to devices not in the private network, but devices outside the private network may not necessarily be able to direct inbound network communications to devices included in the private network.

The Internet refers to a decentralized global network of interoperable networks that comply with the Internet Protocol (IP). It is noted that there are several versions of the Internet Protocol. Here, the term "Internet Protocol," "IP," and/or similar terms, is intended to refer to any version, now known and/or later developed of the Internet Protocol. The Internet includes local area networks (LANs), wide area networks (WANs), wireless networks, and/or long haul public networks that, for example, may allow signal packets and/or frames to be communicated between LANs. The term "World Wide Web" ("WWW" or "Web") and/or similar terms may also be used, although it refers to a part of the Internet that complies with the Hypertext Transfer Protocol (HTTP). For example, network devices may engage in an HTTP session through an exchange of appropriately substantially compatible and/or substantially compliant signal packets and/or frames. It is noted that there are several versions of the Hypertext Transfer Protocol. Here, the term Hypertext Transfer Protocol, HTTP, and/or similar terms is intended to refer to any version, now known and/or later developed. It is likewise noted that in various places in this document substitution of the term "Internet" with the term "World Wide Web" ("Web") may be made without a significant departure in meaning and may, therefore, not be inappropriate in that the statement would remain correct with such a substitution.

Although claimed subject matter is not in particular limited in scope to the Internet and/or to the Web; nonetheless, the Internet and/or the Web may without limitation provide a useful example of an embodiment at least for purposes of illustration. As indicated, the Internet and/or the Web may comprise a worldwide system of interoperable networks, including interoperable devices within those networks. The Internet and/or Web has evolved to a public, self-sustaining facility that may be accessible to tens of millions of people or more worldwide. Also, in an embodiment, and as mentioned above, the terms "WWW" and/or "Web" refer to a part of the Internet that complies with the Hypertext Transfer Protocol. The Internet and/or the Web, therefore, in this context, may comprise an service that organizes stored content, such as, for example, text, images, video, etc., through the use of hypermedia, for example. A HyperText Markup Language ("HTML"), for example, may be utilized to specify content and/or to specify a format for hypermedia type content, such as in the form of a file and/or an "electronic document," such as a Web page, for example. An Extensible Markup Language ("XML") may also be utilized to specify content and/or format of hypermedia type content, such as in the form of a file or an "electronic document," such as a Web page, in an embodiment. Of course, HTML and/or XML are merely example languages provided as illustrations. Furthermore, HTML and/or XML (and/or similar terms) is intended to refer to any version, now known and/or later developed of these languages. Likewise, claimed subject matter is not intended to be limited to examples provided as illustrations, of course.

As used herein, the term "Web site" and/or similar terms refer to a collection of related Web pages. Also as used herein, "Web page" and/or similar terms refer to any electronic file and/or electronic document, such as may be accessible via a network, including by specifying a URL for accessibility via the Web, in an example embodiment. As alluded to above, in one or more embodiments, a Web page may comprise content coded using one or more languages, such as, for example, markup languages, including HTML and/or XML, although claimed subject matter is not limited in scope in this respect. Also, in one or more embodiments, application developers may write code in the form of JavaScript, for example, to provide content to populate one or more templates, such as for an application. The term 'JavaScript' and/or similar terms are intended to refer to any now known and/or later developed version of this programming language. However, JavaScript is merely an example programming language. As was mentioned, claimed subject matter is not intended to be limited to examples and/or illustrations.

As used herein, the terms "entry," "electronic entry," "document," "electronic document," "content," "digital content," "item," "integer," "segment," "identifier," "cookie," and/or similar terms are meant to refer to signals and/or states in a physical format, such as a digital signal and/or digital state format, e.g., that may be perceived by a user if displayed, played and/or otherwise executed by a device, such as a digital device, including, for example, a computing device, but otherwise might not necessarily be perceivable by humans (e.g., in a digital format). Likewise, in this context, content (e.g., digital content) provided to a user in a form so that the user is able to perceive the underlying content itself (e.g., hear audio or see images, as examples) is referred to, with respect to the user, as "consuming" content, "consumption" of content, "consumable" content and/or similar terms. For one or more embodiments, an electronic document may comprise a Web page coded in a markup language, such as, for example, HTML (hypertext markup language). In another embodiment, an electronic document may comprise a portion or a region of a Web page. However, claimed subject matter is not intended to be limited in these respects. Also, for one or more embodiments, an electronic document and/or electronic entry may comprise a number of components. Components in one or more embodiments may comprise text, for example, in the form of physical signals and/or physical states (e.g., capable of being physically displayed). Thus, components in one or more embodiments may comprise alphanumeric text, for example, in the form of physical signals and/or physical states (e.g., capable of being physically displayed). Also, for one or more embodiments, components may comprise a graphical object, such as, for example, an image, such as a digital image, and/or sub-objects, such as attributes thereof, which, again, comprise physical signals and/or physical states (e.g., capable of being physically displayed). In an embodiment, content may comprise, for example, text, images, audio, video, and/or other types of electronic documents and/or portions thereof, for example. Likewise, terms such as "recursion," "recursive operation," "code," "encode," "decode," "compress," "decompress," "delta compression," and/or similar terms are meant to refer to operations performed with respect to physical signals and/or physical states.

Also as used herein, one or more parameters may be descriptive of a collection of signal samples, such as one or more electronic documents, and exist in the form of physical signals and/or physical states, such as memory states. For example, one or more parameters, such as referring to an electronic document comprising an image, may include parameters, such as time of day at which an image was captured, latitude and longitude of an image capture device, such as a camera, for example, etc. In another example, one or more parameters relevant to content, such as content comprising a technical article, may include one or more authors, for example. Claimed subject matter is intended to embrace meaningful, descriptive parameters in any format, so long as the one or more parameters comprise physical signals and/or states, which may include, as parameter examples, name of the collection of signals and/or states (e.g., file identifier name), technique of creation of an electronic document, purpose of an electronic document, time and date of creation of an electronic document, logical path of an electronic document (or portion thereof), encoding formats and/or standards used for encoding an electronic document, and so forth.

Signal packets and/or frames, also referred to as signal packet transmissions and/or signal frame transmissions, may be communicated between nodes of a network, where a node may comprise one or more network devices and/or one or more computing devices, for example. As an illustrative example, but without limitation, a node may comprise one or more sites employing a local network address. Likewise, a device, such as a network device and/or a computing device, may be associated with that node. A signal packet and/or frame may, for example, be communicated via a communication channel and/or a communication path, such as comprising a portion of the Internet and/or the Web, from a site via an access node coupled to the Internet. Likewise, a signal packet and/or frame may be forwarded via network nodes to a target site coupled to a local network, for example. A signal packet and/or frame communicated via the Internet and/or the Web, for example, may be routed via a path comprising one or more gateways, servers, etc., that may, for example, route a signal packet and/or frame substantially in accordance with a target and/or destination address and availability of a network path of network nodes to the target and/or destination address. Although the Internet and/or the Web comprise a network of interoperable networks, not all of those interoperable networks are necessarily available and/or accessible to the public.

In particular implementations, a network protocol for communicating between devices may be characterized, at least in part, substantially in accordance with a layered description, such as the so-called Open Systems Interconnection (OSI) seven layer approach and/or description. A network protocol refers to a set of signaling conventions, such as for computing and/or communications transmissions, for example, as may take place between and/or among devices in a network, typically network devices; for example, devices that substantially comply with the protocol and/or that are substantially compatible with the protocol. In this context, the term "between" and/or similar terms are understood to include "among" if appropriate for the particular usage and vice-versa. Likewise, in this context, the terms "compatible with," "comply with," and/or similar terms are understood to include substantial compliance and/or substantial compatibility.

Typically, a network protocol, such as protocols characterized substantially in accordance with the aforementioned OSI description, has several layers. These layers may be referred to here as a network stack. Various types of transmissions, such as network transmissions, may occur across various layers. A lowest level layer in a network stack, such as the so-called physical layer, may characterize how symbols (e.g., bits and/or bytes) are transmitted as one or more signals (and/or signal samples) over a physical medium (e.g., twisted pair copper wire, coaxial cable, fiber optic cable, wireless air interface, combinations thereof, etc.). Progressing to higher-level layers in a network protocol stack, additional operations may be available by initiating network transmissions that are substantially compatible and/or substantially compliant with a particular network protocol at these higher-level layers. For example, higher-level layers of a network protocol may, for example, affect device permissions, user permissions, etc.

A virtual private network (VPN) may enable a remote device to more securely (e.g., more privately) communicate via a local network. A router may allow network communications in the form of network transmissions (e.g., signal packets and/or frames), for example, to occur from a remote device to a VPN server on a local network. A remote device may be authenticated and a VPN server, for example, may create a special route between a local network and the remote device through an intervening router. However, a route may be generated and/or also regenerated if the remote device is power cycled, for example. Also, a VPN typically affects a single remote device.

As suggested previously, various types of content are often compressed, such as for storage and/or communication. Likewise, particular types of content often affect a particular type of compression to be employed, for reasons such as speed, amount of compression, and/or, in some cases, to take advantage of particular aspects of particular content for which some compression techniques may be more suited. Here, in an embodiment, content in the form of text, such as alphanumeric text of various sorts, is to be compressed. The text may be arbitrary in some cases, but is not necessarily arbitrary in all cases.

With other forms of content, the content itself may be arranged and/or otherwise organized to be consumed together, such as in the form of an image, a video, or a recording, as examples. Likewise, here, with respect to alphanumeric text, an arrangement or organization of such content is referred to as a "table" of textual (e.g., text) content, just as "recording" refers to an arrangement or organization of audio content. Of course, in some other contexts, other terms might be used to refer to an arrangement of textual content, such as a "document" and/or an "electronic document," as examples. It is likewise appreciated that these terms such as "table" or "electronic document" refer to a logical arrangement rather than a physical arrangement in memory. For example, a "table" of text may be physically stored in memory in a manner that does not necessarily correspond to the logical association created in the table.

Likewise, a "table" of text content may be referenced using a parameter identifier, such as previously described. For example, a table of content associated with a particular user, may be referred to using a "user identification parameter" or a "user identifier," as examples. Of course, other identifiers and/or identification parameters may correspond to other entities besides users. For example, user identification parameter, may be transmitted to a media network. In this context, continuing, however, with reference to users, a user identification parameter, for example, may comprise one or more physical signals, such as electronic transmissions, and/or one or more physical states, such as memory states, employed to identify textual content associated with a particular user and/or an account of a particular user, for example. Any given user identifier, or user identification parameter, may not necessarily be unique by itself; however, the term user identifier, or simply "identifier," in this context, may include several identifiers and/or identification parameters that if taken together may be employed to uniquely designate textual content associated with a particular user and/or a particular user account, such as, for example, in connection with an Internet service, as an example. It should be noted that identifiers may additionally pertain to entities, such as locations, households, geographic areas, groups of individuals, and claimed subject matter is not limited in scope in this respect, as previously indicated. Thus, although in example embodiments discussed herein user identifiers are employed as illustrations, identifiers are not limited to identifying users.

As the term is used herein, as indicated above, the term "table" refers to text and/or alphanumeric content. For example, text content of a table may comprise one or more characters employed as identifiers, such as identifiers to label one or more portions or segments of other content, such as video, audio, and/or multimedia content, for example. Text content of a table may also refer to text and/or alphanumeric content, such as social security numbers, telephone numbers, Internet addresses, street addresses, post office addresses, longitude/latitude coordinates, driver's license numbers, credit card numbers, part numbers, serial numbers, and/or a wide variety of other types of text and/or alphanumeric content.

In embodiments, a table may comprise a number of entries, such as 10, 20, 50, or many more, for example, although claimed subject matter is not limited to any particular number of entries. In particular embodiments, an order in which entries may be arranged or sorted within a table may have an associated meaning. However, in certain embodiments, a table may undergo lossy compression, so that a table that has been compressed and decompressed may loss some content. As one example, in a lossy compression, an initial order of entries in a table may not be preserved after decompression. Of course, lossy compression may affect a table in other ways, and claimed subject matter is not limited in scope in this respect.

As the term is used herein, a "multiple-precision integer" refers to an integer that comprises an unspecified (e.g., not predetermined) length. A multiple-precision integer may be distinguished, for example, from a typical fixed-precision integer, which may comprise between 8 bits and 64 bits of precision, that typically may accord with a size of a computer processor register, for example. In contrast to a fixed-precision integer, a multiple-precision integer comprises an integer having a length limited, for example, by available memory of a host computing system. In embodiments, a multiple-precision integer may be stored in a memory accessible to one or more computer processors as a variable-length array of binary digits that may, for example, comprise a length corresponding to a multiple of two.

In one possible example, one or more cookies and/or other parameters assigned to a user or other entity, for example, may also be linked with and/or associated with a table. Thus, in one embodiment, a cookie, or other user identification parameter, may be linked with and/or associated with one or more tables, in which content entries correspond to video segment identifiers, as an example. In another embodiment, an identification parameter may be linked with and/or associated with a table, in which content entries may comprise employee numbers associated with the particular identification parameter of the table. It should be noted that claimed subject matter is not intended to be limited to a particular use case of identification parameters linked and/or associated with a particular table.

Internet content providers (e.g., content sources), which may include media networks, such as the Yahoo!™ network, for example, may be increasingly seeking ways to attract users to their networks and/or to retain users within their networks for extended periods of time. A media network may, for example, comprise an Internet Web site and/or group of Web sites having one or more sections. For instance, the Yahoo!™ network includes Web sites located within different categorized sections, such as sports, finance, current events, and/or games, to name just a few non-limiting examples among a variety of possible examples. To attract and/or retain users within its network, Yahoo!™ and/or other media networks may continually strive to provide and/or be a source of content relating to categorized sections that may be interesting and/or desirable to users. Additionally, for the benefit of individuals and the media network, a media network may utilize targeted advertising based, at least in part, on a user's history of interactions with, for example, the Internet, such as a user's shopping history, browsing history, and/or other aspects. Interactions with, for example, the Internet may include particular news items and/or articles displayed to a user, particular search queries formulated by a user, particular items and/or services from a shopping website recently visited by a user, and so forth. A user's interactions with the Internet may include additional activities, and claimed subject matter is not intended to limited to these illustrative examples.

To discover a user's browsing, shopping, and/or purchasing behaviors, a network may utilize a user identification parameter, for example, to identify a particular user and/or group of users utilizing a client device, such as Internet users, for example. A user, such as an Internet user, may benefit from a media network discovering the user's interests, behaviors, shopping habits, and so forth. For example, if an Internet user were to be identified as being likely to have an interest in particular types of sports equipment, an advertiser of the particular type of sports equipment may be willing to pay a premium to display a relevant advertisement to the user, for example. Likewise, a user may be provided with special offers, coupons, notifications of advertiser-sponsored activities, and so forth, for which the user may be likely to have a particular interest. Additionally, a user may be spared what may sometimes appear to be an onslaught of advertising content with which the user may have little interest and/or which may have little influence on the user's purchasing decision. Further, such potentially relevant advertising content, as well as advertising content for which a user may have implicitly or explicitly indicated as being "not interested," for example, may comprise a less efficient use of media network resources, such as computational resources, network bandwidth, and so forth.

In some instances, based at least partially on a user's browsing history, for example, offers for recently-viewed items and/or related items may be presented to a user if a user navigates away from a shopping website, for example, to visit another website. Thus, in an implementation, if a user interacts with a website specializing in athletic footwear and, subsequently, navigates away to visit a website at which news videos may be viewed, a brief advertisement video for athletic footwear may be displayed prior to display of a news video. In some instances, a brief video pertaining to products for which a user may have previously shopped, such as related and/or complementary products, may be displayed.

Relevant advertisements, such as the aforementioned examples, may benefit a user by allowing a user to extend an Internet shopping experience, for example, and may expose a user to products and/or services that he or she may not have previously considered. Additionally, relevant advertisements may benefit an advertiser by enabling the advertiser to offer products and/or services that a user may be more likely to purchase, for example. Relevant advertisements may benefit a user and an advertiser in additional ways, and claimed subject matter is not limited in scope in this respect.

In particular embodiments, if a user navigates away from, for example, a shopping website to a news website, an advertisement that may be relevant to one or more recently-viewed products and/or services may be of increased benefit if the advertisement is displayed shortly after a client device establishes contact with the news website. If, for example, a user is obliged to wait for what may appear to comprise even a relatively short length of time, a user may become discouraged and/or irritated by what may appear as an noticeable pause in delivery of content, for example. Consequently, a user may navigate away from a news website without being exposed to a potentially beneficial, relevant advertisement, for example. Navigation away from the news website in this illustration may bring about additional unattractive outcomes, such as the user missing out on one or more special offers, limited-time offers, advertiser-sponsored activities, as well as giving rise to lost revenue opportunities for advertisers, for example.

Thus, advertisers, media networks and/or content sources, for example, may have an interest in providing what may be perceived as rapid and/or virtually seamless delivery of content, such as relevant advertising content, for example, to client device users, for example. Rapid delivery of content, such as relevant advertising content, may enhance a user's (e.g., an Internet user's) shopping experience by providing beneficial content, for example, in a timely manner. In embodiments, timely delivery of advertising content may reduce likelihood that a user navigates away from a website, such as a news website, prior to display of potentially-beneficial advertising content, for example. Accordingly, a user may remain within a media network for an extended period of time, which, as previously alluded to, may permit a media network, such as the Yahoo!™ network, for example, to increase a media network's value to its advertisers, for example. Timely delivery of content, such as advertising content, may bring about additional benefits to advertisers, media networks, and/or users, for example, and claimed subject matter is not limited in scope in this respect.

In particular embodiments, if a user selects or "clicks" on a displayed icon, for example, to initiate display of a news video clip, it may be advantageous to a user and to an advertiser to begin display of an advertising video clip or "segment," for example, approximately within a range of approximately 100.0 ms to approximately 250.0 ms, although claimed subject matter is not limited in scope in this respect. Thus, in some embodiments, it may be beneficial to initiate display of an advertising segment in less than approximately 100.0 ms, for example. In other embodiments, initiating display of an advertising segment in greater than approximately 250.0 ms may nonetheless impart certain benefits and, again, claimed subject matter is not limited to a particular range of time periods within which advertising content is displayed.

Thus, in embodiments, for advertising content and/or other forms of specialized content, such as public service announcements, for example, to be displayed within, for example, approximately 100.0 ms, an advertising content supplier may be allotted a time budget, for example, approximately in a range of between approximately 1.0 ms and approximately 5.0 ms to select content for display to a user, such as an Internet user. In embodiments, abbreviated time intervals may permit selected advertising content to be dynamically rendered, for example, and transported via an intervening communications network, such as the Internet, for display using a client computing device. Thus, responsive to obtaining identification parameters of a client device user, for example, an advertising content supplier, for example, may, within an allotted 1.0-5.0 ms (approximate) range, for example, obtain or access one or more tables, which may provide a list of advertising content segments, for example, associated with one or more user identification parameters. For example, simply for purposes of illustration, a table content may comprise a listing of one or more previously viewed video segments, for example, that a user may have previously viewed, or may have viewed more than a threshold number of times over a given time period (such as three times within a previous 30-day period). In this example instance, an advertising content supplier may not wish to display previously-viewed video segments to a particular user, but may, instead, select one or more other video segments for display. In another instance, again, simply for purposes of illustration, in response to determining that a user has recently visited a shopping website specializing in athletic shoes, content entries may comprise one or more video segments for athletic shoes, gym bags, or the like, for example, that may be relevant based, at least in part, on a users shopping behaviors. A table may comprise other types of content entries, and claimed subject matter is not limited in scope in this respect.

In particular embodiments, responsive to a time allotment of, for example, approximately in the range between approximately 1.0 ms and approximately 5.0 ms, a table associated with and/or linked with a user identification parameter may be limited in size, to permit relatively fast access. In particular embodiments, a table associated with and/or linked with a user identification parameter may also be compressed, for example, to a size approximately in the range of approximately 2.0 kilobytes to approximately 128.0 kilobytes, for example. However, it should be noted that certain embodiments may utilize compressed tables smaller than, for example, 2.0 kilobyte, such as approximately 1.5 kilobyte, approximately 1.0 kilobyte, and so forth. Further, certain embodiments may utilize tables compressed to a size larger than, for example, approximately 128.0 kilobytes, such as approximately 256.0 kilobytes, or larger, for example, and claimed subject matter is intended to embrace tables of any size. In particular embodiments, delta compression, as shall be explained, may be utilized to compress a table associated with and/or linked with a particular user identification parameter. A lossy compression approach may also employ entropy encoding and/or similar approaches, for example, although claimed subject matter is not necessarily limited in scope in this respect.

Figure 1:
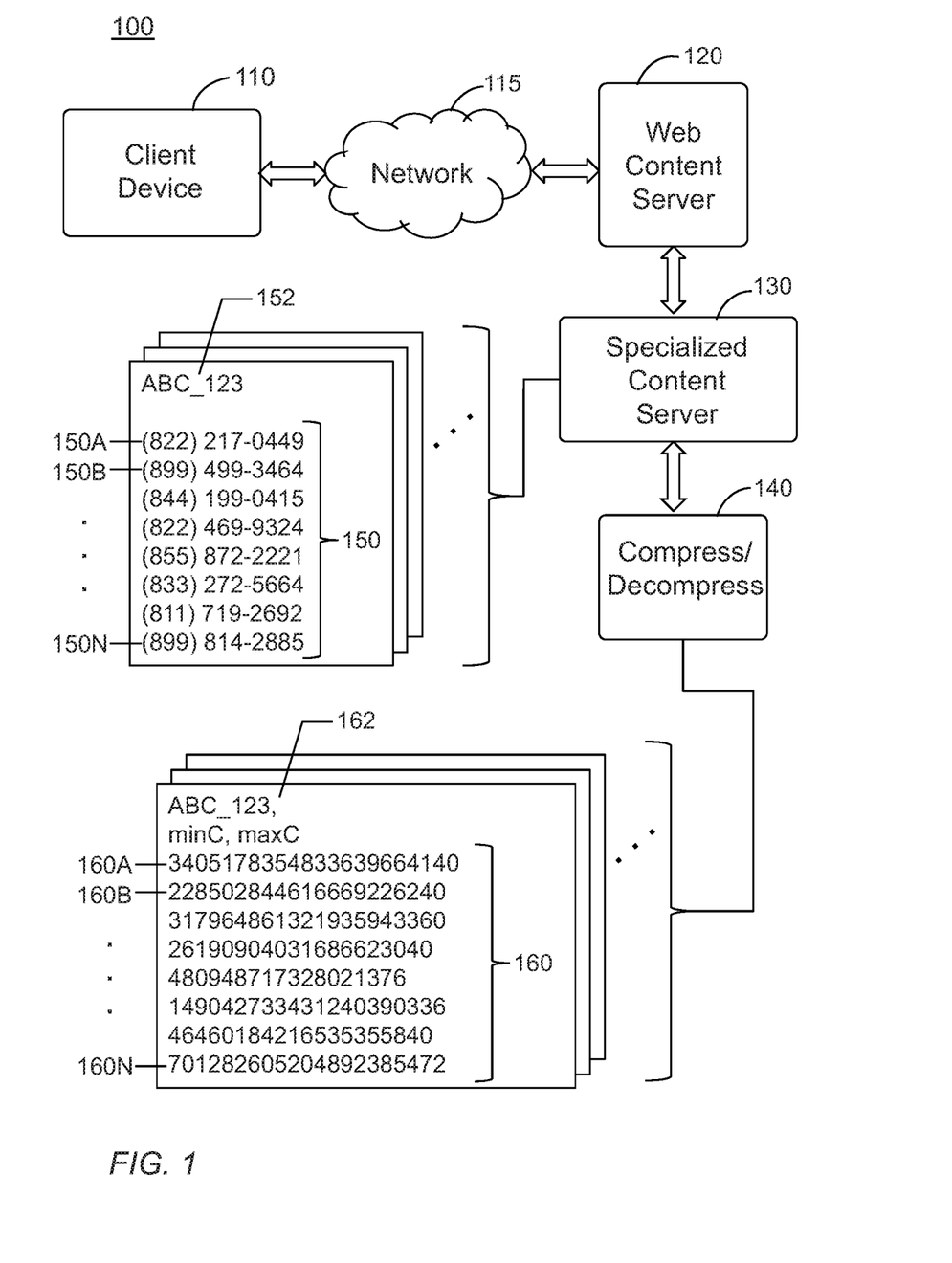
FIG. 1 is a schematic diagram of a system that may be employed to perform content compression according to an embodiment.

FIG. 1 is a schematic diagram of a system that may be employed, such as in a client-server type interaction, for example, to perform content compression according to an embodiment 100. Thus, in FIG. 1, client device 110 may comprise any type of computing device, such as a handheld computing device, desktop computer, laptop computer, tablet computer, smart phone, wearable computer, and so forth, and claimed subject matter is not limited in scope in this respect. In embodiments, client device 110 may permit a user to access a network, such as the Internet, to shop online retailers, view e-mails, news and advertising video segments, and so forth. Client device 110 may transmit a cookie, for example, or other user identification parameter, via network 115, which may identify client device 110 to a server, such as a web content server 120. Client device 110 may perform a variety of additional tasks, and claimed subject matter is not limited in scope in this respect.

In one possible embodiment, a server, such as web content server 120 may comprise, for example, an online news provider and/or other media outlet that may render one or more types of video, such as news videos, crowd-sourced videos, and so forth, just to name a few examples. In an embodiment, prior to and/or during viewing of a video clip and/or video segment, a server, such as web content server 120 may display one or more advertising video segments, which may provide a mechanism to compensate a content server, for example, for processing, rendering, routing, and/or communicating, for example, news or other video segments for consumption by a user of a client device 110, for example. A server, such as web content server 120, may obtain advertising video segments, for example, from another server, such as specialized content server 130, which may operate as a source of advertising video segments, for example. As previously alluded to, advertising video segments may be selected, such as by a server, such as web content server 120, based, at least in part, on a client device user's recent browsing and/or shopping history. Also as previously alluded to, in embodiments, it may be advantageous for a server, such as web content server 120 to bring about display of advertising video segments, news videos, and/or other content in a timely fashion without, for example, a highly noticeable pause between selection of a video segment for viewing and initiation of, for example, performance (e.g., playing) of an advertising video segment, for example. A server, such as server 120 may access another server such as specialized content server 130, in this example which may provide access to one or more reference content tables linked with and/or associated with a user identification parameter, for example.

In particular embodiments, a table may comprise one or more content entries, which may correspond to, for example, advertising video segment identifiers in an embodiment, as an example. In particular embodiments, an advertising video segment may be identified by an entry, such as 150A, 150B, . . . 150N, for example, and may comprise a listing of advertising video segments that a user of a client device 110 has viewed more than a threshold number of times (such three times within a previous month), again, merely as a nonlimiting illustrative example. Thus, one or more tables, such as 150 (e.g., entries 150A, 150B, and so forth) may correspond to video segments that may not be particularly beneficial if displayed to a user of a client device 110. In another embodiment, in response to determining that a user has visited one or more shopping websites, entries 150A, 150B, . . . 150N may comprise identifiers corresponding to advertising video segments that may be relevant to one or more items, for example, which a user may have considered for online purchase, for example. In the example of FIG. 1, parameter 152 (shown as ABC_123) comprise, for example, a cookie and/or other user identification parameter that may be utilized by a server, such as web content server 120 to identify a user of client device 110.

In certain embodiments, table 150 may comprise entries, for example, which may undergo lossy compression, utilizing compress/decompress block 140, for example, to bring about transformation of a table to form, for example, one or more multiple-precision integers. As will be described herein below, as an illustrative example, compress/decompress block 140 may operate to bring about compression approximately in the range of approximately 25.0% to approximately 50.0% compared to uncompressed entries. However, in other embodiments, compress/decompress block 140 may operate to bring about compression of less than approximately 25.0%, such as approximately 15.0%, approximately 20.0%, for example, or may operate to bring about compression of greater than approximately 50.0%, such as approximately 60.0%, for example, and claimed subject matter is not limited in scope in this respect. Thus, in embodiments, table 150 may be transformed into table 160, which may comprise multiple-precision integer entries 160A, 160B, . . . 160N, for example, in an embodiment, which may be associated and/or linked with user identification parameter 162.

Figure 2:
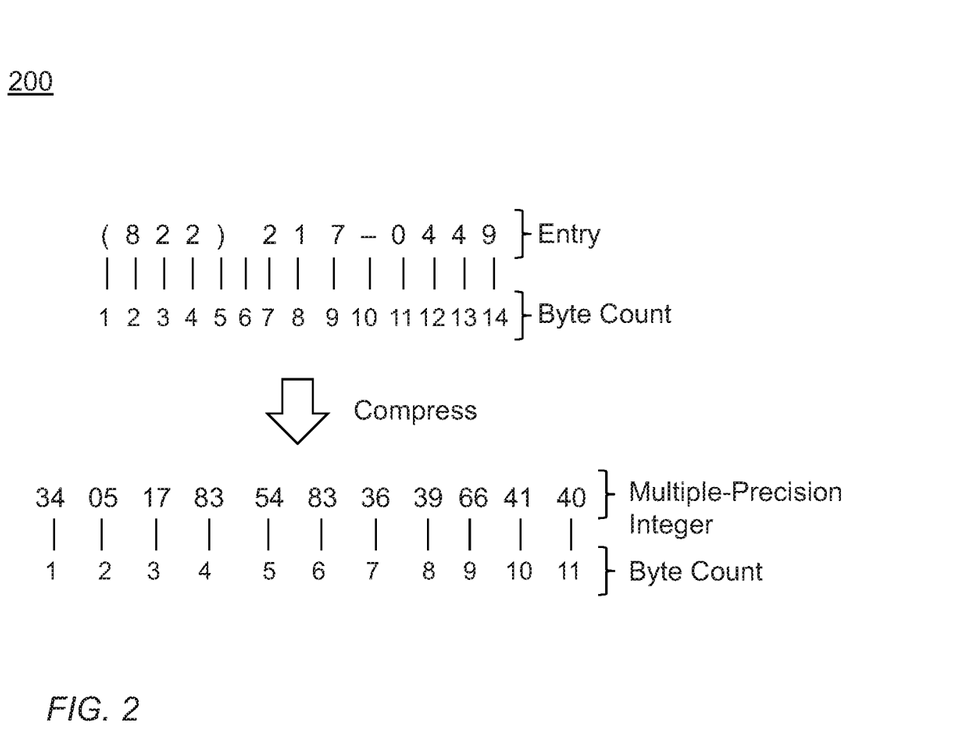
FIG. 2 shows a relatively simple compression transformation of a content entry according to an embodiment.

FIG. 2 shows a relatively simple compression transformation table according to an embodiment 200 for illustration purposes. In FIG. 2, an advertising segment identifier comprising ASCII characters "(822 217-0449)" consumes approximately 14 bytes and an additional byte to indicate a "new line" character (e.g., carriage return). In the embodiment of FIG. 2, "(822 217-0449)" may be compressed to form a multiple-precision integer comprising alphanumeric characters "34 05 17 83 54 83 36 39 66 41 40" consuming fewer memory resources (e.g., 11 bytes). It should be noted that the example of FIG. 2 embodies one relatively simple example to illustrate a general notion of lossy compression, such as according to at least some embodiments, and claimed subject matter is not limited in scope in this respect. As will be described herein below, in some embodiments, additional compression may be realized by reordering entries and obtaining a difference (e.g., via delta compression) between adjacent reordered entries, for example. Thus, as suggested previously, in some embodiments, an aspect of content loss from lossy compression may relate to not preserving an initial order.

To further describe particular embodiments, such as the embodiments of FIGS. 1 and 2, for example table 150 of FIG. 1 is repeated below:

$$\left.\begin{aligned} A_0 &= (822)\ 217\text{-}0449 \\ A_1 &= (899)\ 499\text{-}3464 \\ A_2 &= (844)\ 199\text{-}0415 \\ A_3 &= (822)\ 469\text{-}9324 \\ A_4 &= (855)\ 872\text{-}2221 \\ A_5 &= (833)\ 272\text{-}5664 \\ A_6 &= (811)\ 719\text{-}2692 \\ A_7 &= (899)\ 814\text{-}2885 \end{aligned}\right\}150$$

In particular embodiments, table 150 may be summarized notationally as:

$$B=(A_0, A_1, \ldots, A_{|B|}), \text{ in which } |B|=7$$

and in which $A_i = (a_{i0} a_{i1} \ldots a_{i|A_i|})$ (1)

In which, for example, $A_0$=(822) 217-0449, $A_1$=(899) 499-3464, etc.

In an embodiment, entries comprising table 150 (e.g., $A_0$, $A_1$, and so forth) may be processed to transform portions of entries to equivalent byte values according to an encoding approach. In this context, an equivalent byte value refers to mapping of characters, such as individual characters, of a table entry to values, such as integer-numbered values, for example. In particular embodiments, characters of table entries, such as individual characters of table entries, are to be converted to equivalent byte values according to a mapping to equivalent values, in one embodiment, substantially in accordance with a revision of the American Standard Code for Information Interchange (ASCII). Utilizing an ASCII standard, for example, a "(" of table entry "(822) 217-0449" may correspond to an ASCII equivalent byte value of 41, an "8" may correspond to an ASCII equivalent byte value of 56, a "2" may correspond to an ASCII equivalent byte value of 50, and so forth. Thus, in one embodiment, conversion to ASCII symbols of an entry of a table, such as, A-Z, 0-9, and other characters, such as left and right parentheses, dashes, spaces, and so forth, to equivalent byte values, may include a scanning process to determine that, for example, a first entry (e.g., "(822) 217-0449") corresponds to an ASCII equivalent byte value of 40 56 50 50 41 32 50 49 55 45 48 52 52 and 57, for example. It should be noted that a variety of character symbol encoding approaches, such as UTF-8, UTF-16, UTF-32, substantially in accordance with ISO/IEC 10646:2014 (available from the International Organization for Standardization, ISO Central Secretariat, Chemin de Blandonnet 8, CP 401, 1214 Vernier, Geneva, Switzerland), may be utilized, and claimed subject matter is not limited in scope in this respect.

In an embodiment, one or more scanning processes, for example, in an embodiment, to indicate ASCII equivalent byte values corresponding to an entry, may be utilized to determine a lower equivalent byte value=$(Q_i=\min(A_i))$ of a table. Additionally, one or more scanning processes may be utilized to determine an upper equivalent byte value $(W_i=\max(A_i))$ for a character of a table. In particular embodiments, a scanning process to determine a lower equivalent byte value and an upper equivalent byte value for a table comprising entries may be expressed notationally substantially in accordance with:

$$\text{Lower equivalent byte value}=\min(C)=\min(Q_0Q_1\ldots Q_{|Q|}) \quad (2)$$

$$\text{Upper equivalent byte value}=\max(C)=\max(W_0W_1\ldots W_{|W|}) \quad (3)$$

For table 150 of FIG. 1, one or more scanning processes may indicate a lower equivalent byte value of 32, which corresponds to a spacebar (" ") occurring after the left parenthetical character (e.g., ")"), for example. One or more scanning processes may indicate an upper equivalent byte value of 57, which corresponds to a "9" occurring, for example, as a final character of $A_0$. Accordingly, a base (K) may be generated substantially according to expression 4 below:

$$K=\max C-\min C+2=57-32+2=27 \quad (4)$$

In particular embodiments, a recursive process may be utilized to generate digits of a multiple-precision integer utilizing base K from expression 4 substantially according to expression 5, below:

$$v(k,i)=K*(v(k-1,i)+a_{i,|A_i|-k}-\min C+1 \quad (5)$$

In expression 5, v may be initialized as $v(0,i)=0$. $V_i$ may comprise a multiple-precision integer corresponding to ASCII equivalent byte values, such as provided in expression 6, below:

$$V_i=v(|A_i|,i) \quad (6)$$

In an example, to illustrate a recursive process that substantially accords with expressions 5 and 6, entry (822) 217-0449 may be compressed into a single multiple-precision integer. As previously determined, minC=32, maxC=57. Thus, K=maxC−minC+2=nBase=27. Thus, for $A_0$=(822) 217 0449, initializing V=0.0:

$$V=(V+(a(14)-32+1))*27=(0+(57-32+1))*27=702, \text{ for } a(14)=702.$$

Continuing the recursive process for a(13) through a(0):

$$V=(V+(52-32+1))\times 27=(702+(52-32+1))\times 27=19521,$$

$$V=(V+(52-32+1))\times 27=(19521+(52-32+1)\times 27=527634$$

$$V=(V+(48-32+1))\times 27=(527634+(48-32+1))\times 27=14246577$$

$$V=(V+(45-32+1))\times 27=(14246577+(45-32+1))\times 27=384657957$$

$$V=(V+(55-32+1))\times 27=(384657957+(55-32+1))\times 27=10385765487$$

$$V=(V+(49-32+1))\times 27=(10385765487+(49-32+1))\times 27=280415668635$$

$$V=(V+(50-32+1))\times 27=(280415668635+(50-32+1))\times 27=7571223053658$$

$$V=(V+(32-32+1))\times 27=(7571223053658+(32-32+1))\times 27=204423022448793$$

$$V=(V+(41-32+1))\times 27=(204423022448793+(41-32+1))\times 27=5519421606117681$$

$$V=(V+(50-32+1))\times 27=(5519421606117681+(50-32+1))\times 27=149024383365177900$$

$$V=(V+(50-32+1))\times 27=(149024383365177900+(50-32+1))\times 27=4023658350859803813$$

$$V=(V+(56-32+1))\times 27=(4023658350859803813+(56-32+1))\times 27=108638775473214703626$$

$$V=V+(40-32+1))=108638775473214703626+(40-32+1)=108638775473214703635$$

$$V=108638775473214703635$$

Likewise, a recursive process may be utilized to compute a multiple-precision integer corresponding to entries $A_1$-$A_7$. Thus, processing may give rise to entries, as below, in an embodiment:

| Original (Uncompressed) Reference Content Entry | Multiple-Precision Integer |
|---|---|
| (822) 217-0449 | 108638775473214703635 |
| (899) 499-3464 | 88676807301426986937 |
| (844) 199-0415 | 91978271603402320125 |
| (822) 469-9324 | 88072105015083800331 |
| (855) 872-2221 | 75907437292538994492 |
| (833) 272-5664 | 86688335206121862058 |
| (811) 719-2692 | 81032893048760320710 |
| (899) 814-2885 | 93051580581893262816 |

In certain embodiments, multiple-precision integers, such as those above, for example, may be reordered, such as in descending order (e.g., smallest multiple-precision integer to largest multiple-precision integer) so as to bring about a positive difference or "delta" among successive entries. Accordingly, multiple-precision integers 1 may be reordered, such as shown below, for example. Below, a column labeled "Byte Count" is included to indicate a number of bytes consumed to entropy encode differences between reordered adjacent entries. In particular embodiments, a Byte Count may be determined utilizing Little Endian Base 128 (LEB128), or any other form of variable-length code compression that may be useful in a storage of an arbitrarily large integer, such as a multiple-precision integer.

TABLE 2

| Multiple-Precision Integer (Original order) | Multiple-Precision Integer (Reordered) | Difference between Reordered Adjacent Entries | Byte Count (LEB-128) |
|---|---|---|---|
| 108638775473214703635 | 75907437292538994492 | 75907437292538994492 | 10 |
| 88676807301426986937 | 81032893048760320710 | 5125455756221326218 | 9 |
| 91978271603402320125 | 88072105015083800331 | 7039211966323479621 | 9 |
| 88072105015083800331 | 88676807301426986937 | 604702286343186606 | 9 |
| 75907437292538994492 | 88688335206121862058 | 11527904694875121 | 8 |
| 88688335206121862058 | 91978271603402320125 | 3289936397280458067 | 9 |
| 81032893048760320710 | 93051580581893262816 | 1073308978490942691 | 9 |
| 93051580581893262816 | 108638775473214703635 | 15587194891321440819 | 10 |

Thus, in particular embodiments, a table, such as table 150, for example, may be compressed and subsequently encoded such as entropy encoded, for storage in a memory accessible to one or more processors of a computing device. In addition to a compressed table, additional parameters, such as minC and maxC, may also be stored in memory. In certain embodiments, a table may be compressed so as to consume a fraction of a computer memory than would otherwise be consumed by storage of content utilizing less compression. Hence, in embodiments, a computer processor may access table corresponding to one or more user identification parameters by accessing a relatively small range, for example, of memory addresses. Thus, computer memory access time may be reduced, which, in turn, may bring about more timely processing of, for example, video segment identifiers. Reduction in computer memory consumed by storage of content groups may bring about additional benefits and/or advantages, and claimed subject matter is not limited in scope in this respect.

In certain embodiments, a computer processor, for example, may access a memory to decompress multiple-precision integers to form, for example, a table. Compressed tables may be encoded such as using entropy encoding, for storage into memory along with one or more parameters utilized to decompress multiple-precision integers. For example, as shown in FIG. 1, table 160, comprising entries 160A-160N, may be entropy or otherwise encoded in a computer memory along with, for example, minC and maxC (not shown in FIG. 1).

In a relatively simple example to illustrate a decompression process substantially in accordance with an embodiment, an entry "ABC" may be compressed as follows:

"A"⇒Equivalent byte value: 65
"B"⇒Equivalent byte value: 66
"C"⇒Equivalent byte value: 67

Thus, for entry "ABC," K=maxC−minC+2=67−65+2=4. Computing an integer value for a="ABC," for example, may be performed as follows:

$V=(V+(a(3)-\text{min}C+1))*n\text{Base}=(0+(67-65+1))*4=12$ $V=(V+(a(2)-\text{min}C+1))*n\text{Base}=(12+(66-65+1))*4=56$ $V=(V+(a(1)-\text{min}C+1)=56+(65-65+1)=57$ $V=57$ Thus, in a relatively simple example, an entry "ABC" may be compressed and encoded, such as entropy encoded, as a single integer, such as 57. Likewise, an entry "CBA" may be compressed into an integer value, as follows:

$a=\text{"CBA"}$ $V=(V+(a(3)-\text{min}C+1))*n\text{Base}=(0+(65-65+1))*4=4$ $V=(V+(a(2)-\text{min}C+1))*n\text{Base}=(4+(66-65+1))*4=24$ $V=V+(a(1)-\text{min}C+1)=24+(67-65+1)=27$ $V=27$ Accordingly, compression of entries "ABC" and "CBA" may be summarized below:

TABLE 3

| Uncompressed Reference Content Entry | Uncompressed Size (Including "New Line" Byte) | Reference Content Entry (Encoded as Integer) | Reordered Integers | Difference Between Reordered Adjacent Entries | Byte Count (LEB-128) |
|---|---|---|---|---|---|
| ABC | 4 | 57 | 27 | 27 | 1 |
| CBA | 4 | 27 | 57 | 30 | 1 |
| Total Bytes | 8 | | | | 2 |

Thus, as shown above, compressed entries "ABC" and "CBA" may be entropy encoded, for example, utilizing two bytes. However, in embodiments, in addition to entries, minC, maxC, may additionally be encoded and stored in a memory accessible to one or more computer processors.

In an embodiment, a process for decompressing may involve accessing one or more computer memory locations to determine minC and maxC. Thus, for the example shown above, a base "K" may be determined as minC−maxC+2=4. Accordingly, to decompress an entry, differences between reordered adjacent entries of a table, for example, may be added together (e.g., 27+30=57). A variable for use with a recursive operation (i) may be computed in accordance with expression 7, below:

$$i=[0,\text{ceil}(\log(v)/\log(K))] \quad (7)$$

Wherein "ceil" indicates use of a "ceiling" operation that rounds in an upward direction (e.g., ceil(2.9)=3.0), v comprises an integer, such as a multiple-precision integer, to be decompressed (e.g., 57). Thus, for an example for which "57" is to be decompressed, i=[0, ceil(log(57)/log(4))]=[0, 3]. In a particular embodiment, expression 8 may be utilized to determine a number of iterations of a recursive operation:

$$v_i=(i=0)\rightarrow\Lambda(i\neq 0)\rightarrow v_{i-1}/K \quad (8)$$

In which, in one or more embodiments, expression 8 may be repeated, for example, until $v_i<K$. Thus, for an example in which "57" is to be decompressed, $v_i$ may be repeated two times until, for example, $v_2=3.56$ is obtained, in which, of course, $3.56<K$ (if $K=4.0$).

$$v_0 = v = 57 \tag{8a}$$

$$v_1 = v_0/K = 57/4 = 14.25 \tag{8b}$$

Truncating $v_1$ so as to remove the remainder, such as 0.25 for this example, truncates 14.25, which results in $v_1=14.0$. Thus, $$v_2 = v_1/K = 14.0/3.56 = 3.93 \tag{8c}$$

Likewise, $v_2$ may be truncated so as to remove the remainder, such as 0.93 for this example, which results in $v_2=3.0$. In an embodiment, after determining that $v=(v_0, v_1, v_2)$, expression 9 may be utilized to determine elements of an entry corresponding to "57:"

$$s_i(v_i \bmod(K)) + \min C - 1 \tag{9}$$

wherein the "mod" operator indicates the "modulus" operation. Thus, substantially in accordance with expression 9:

$$s_0 = (v_0 \bmod(K)) + \min C - 1 = 57 \bmod(4) + 64 - 1 = 1 + 64 - 1 = 64$$

$$s_1 = (v_1 \bmod(K)) + \min C - 1 = 14 \bmod(4) + 64 - 1 = 2 + 64 - 1 = 65$$

$$s_1 = (v_2 \bmod(K)) + \min C - 1 = 3 \bmod(4) + 64 - 1 = 3 + 64 - 1 = 66$$

In an embodiment, $s_0$, $s_1$, and $s_2$ correspond to ASCII equivalent byte values of ABC, as previously described.

To decompress a second entry, such as CBA, for example, a process similar to a process utilized to decompress ABC may be used. Additionally, to decompress entries comprising multiple-precision integers, for example, a process similar to that used to decompress integers as shown above, for example, may be used. Further, although particular embodiments may give rise to reordering of entries, in many instances, reordering may comprise an acceptable form of lossy compression.

Although claimed subject matter is not limited in scope to illustrative embodiments, it is noted that in an embodiment, for example, one potential advantage of employing byte equivalent values relates to computing device architecture in which, processors, for example, are typically designed to process signals and/or states more effectively as bytes or at the so-called "byte level." Likewise, another possible advantage, in connection with compression, may comprise a transformation to multi-precision integers utilizing a base, such as K, as shown in expressions 4 and 5, as an example, relates to content of a table, for example, occupying a higher density of values within a range of values in accordance with a base K, then the range of values, in effect, occupied by the content of the table before the transformation. Hence, this higher density of values results in a type of compression. It is further noted that while lossy compression is employed, as previously described, in comparison with other types of lossy compression, here, a benefit results from having an ability to select that aspect of content that is lost as a result of lossy compression, such as, in an embodiment, table ordering of entries, for example.

Figure 3:
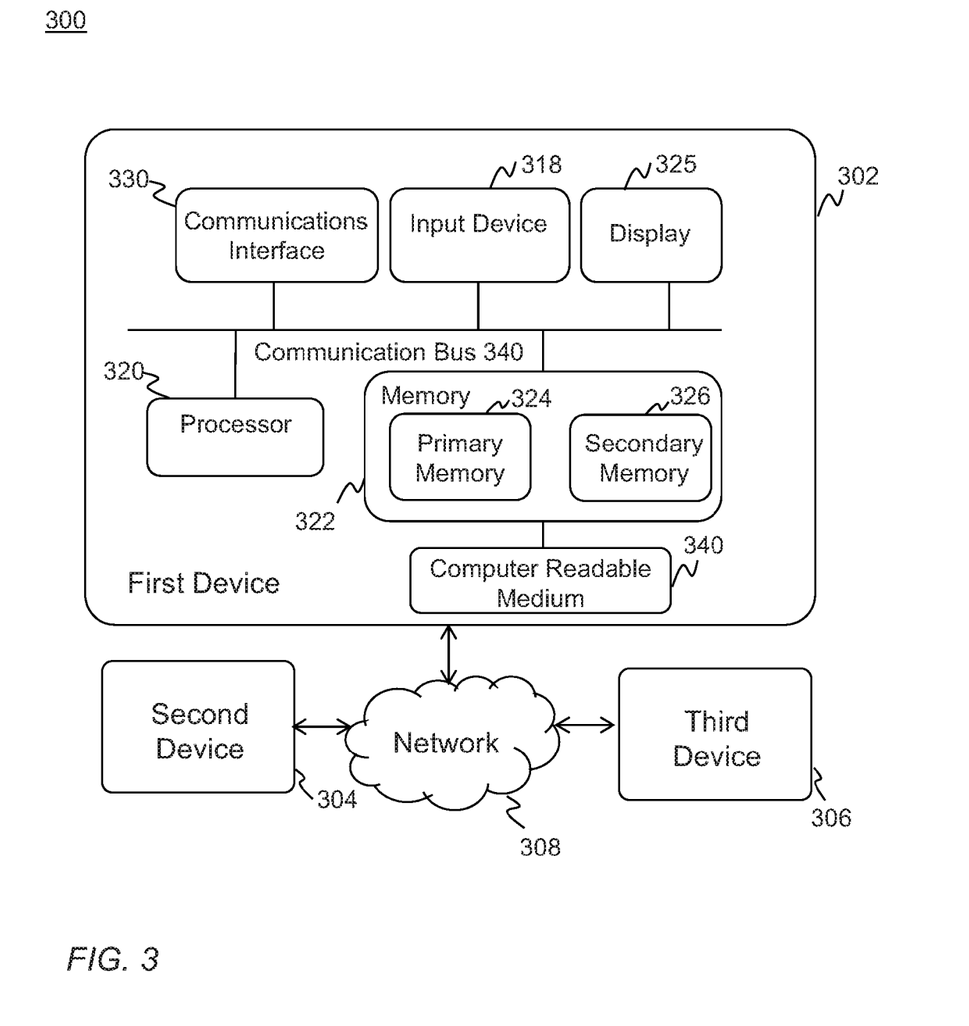
FIG. 3 is an illustration of an embodiment of a system that may be employed to perform content compression and/or content decompression.

FIG. 3 is an illustration of an embodiment of a system that may be employed in a client-server type interaction to content compression and/or content decompression, such as described herein above. In connection with rendering a graphical user interface (GUI) via a device, such as a network device and/or a computing device, for example, computing device 302 ('first device' in figure) may interface with client 304 ('second device' in figure), which may comprise features of a client computing device, for example. Communications interface 330, processor 320, and memory 322, which may comprise primary memory 324 and secondary memory 326, may communicate by way of a communication bus, for example. In FIG. 3, client computing device 302 may comprise one or more sources of analog, uncompressed digital, lossless compressed digital, and/or lossy compressed digital formats for content of various types, such as video, imaging, text, audio, etc., in the form physical states and/or signals, for example. Client computing device 302 may communicate with computing device 304 by way of a connection, such as an internet connection, via network 308, for example. Although computing device 302 of FIG. 3 shows the above-identified components, claimed subject matter is not limited to computing devices having only these components as other implementations may include alternative arrangements that may comprise additional components or fewer components, such as components that function differently while achieving similar results. Rather, examples are provided merely as illustrations. It is not intended that claimed subject matter to limited in scope to illustrative examples.

Processor 320 may be representative of one or more circuits, such as digital circuits, to execute at least a portion of a computing procedure and/or process. By way of example, but not limitation, processor 320 may comprise one or more processors, such as controllers, microprocessors, microcontrollers, application specific integrated circuits, digital signal processors, programmable logic devices, field programmable gate arrays, the like, or any combination thereof. In implementations, processor 320 may execute signal processing to manipulate signals and/or states, to construct signals and/or states, etc., for example.

Memory 322 may be representative of any storage mechanism. Memory 322 may comprise, for example, primary memory 324 and secondary memory 326, additional memory circuits, mechanisms, or combinations thereof may be used. Memory may comprise, for example, random access memory, read only memory, etc., such as in the form of one or more storage devices and/or systems, such as, for example, a disk drive, an optical disc drive, a tape drive, a solid-state memory drive, etc., just to name a few examples. Memory 322 may be utilized to store a program. Memory 322 may also comprise a memory controller (not shown in FIG. 3) for accessing computer readable-medium 340 that may carry and/or make accessible content, which may include code, and/or instructions, for example, executable by processor 320 and/or some other unit, such as a controller and/or processor, capable of executing instructions, for example.

Under direction of processor 320, memory, such as memory cells storing physical states, representing, for example, a program, may be executed by processor 320 and generated signals may be transmitted via the Internet, for example. Processor 320 may also receive digitally-encoded signals from client computing device 302.

Network 308 may comprise one or more network communication links, processes, services, applications and/or resources to support exchanging communication signals between a client computing device, such as 302, and computing device 306 ('third device' in figure), which may, for example, comprise one or more servers (not shown). By way of example, but not limitation, network 308 may comprise wireless and/or wired communication links, telephone and/ or telecommunications systems, Wi-Fi networks, WiMAX networks, the Internet, a local area network (LAN), a wide area network (WAN), or any combinations thereof.

The term "computing device," as used herein, refers to a system and/or a device, such as a computing apparatus, that includes a capability to process (e.g., perform computations) and/or store content, such as measurements, text, images, video, audio, etc. in the form of signals and/or states. Thus, a computing device, in this context, may comprise hardware, software, firmware, or any combination thereof (other than software per se). Computing device 302, as depicted in FIG. 3, is merely one example, and claimed subject matter is not limited in scope to this particular example. For one or more embodiments, a computing device may comprise any of a wide range of digital electronic devices, including, but not limited to, personal desktop and/or notebook computers, high-definition televisions, digital versatile disc (DVD) players and/or recorders, game consoles, satellite television receivers, cellular telephones, wearable devices, personal digital assistants, mobile audio and/or video playback and/or recording devices, or any combination of the above. Further, unless specifically stated otherwise, a process as described herein, with reference to flow diagrams and/or otherwise, may also be executed and/or affected, in whole or in part, by a computing platform.

Memory 322 may store cookies and/or other types of user identification parameters relating to one or more users and may also comprise a computer-readable medium that may carry and/or make accessible content, including code and/or instructions, for example, executable by processor 320 and/or some other unit, such as a controller, and/or processor, capable of executing instructions, for example. A user may make use of input device 318, such as a computer mouse, stylus, track ball, keyboard, and/or any other similar device capable of receiving user actions and/or motions as input signals. Likewise, a user may make use of an output device, such as display 325, a printer, etc., and/or any other device capable of providing signals and/or generating stimuli for a user, such as visual stimuli, audio stimuli and/or other similar stimuli.

Regarding aspects related to a communications and/or computing network, a wireless network may couple client devices with a network. A wireless network may employ stand-alone ad-hoc networks, mesh networks, Wireless LAN (WLAN) networks, cellular networks, and/or the like. A wireless network may further include a system of terminals, gateways, routers, and/or the like coupled by wireless radio links, and/or the like, which may move freely, randomly and/or organize themselves arbitrarily, such that network topology may change, at times even rapidly. A wireless network may further employ a plurality of network access technologies, including Long Term Evolution (LTE), WLAN, Wireless Router (WR) mesh, 2nd, 3rd, or 4th generation (2G, 3G, or 4G) cellular technology and/or the like. Network access technologies may enable wide area coverage for devices, such as client devices with varying degrees of mobility, for example.

A network may enable radio frequency and/or other wireless type communications via a wireless network access technology and/or air interface, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, ultra wideband (UWB), 802.11b/g/n, and/or the like. A wireless network may include virtually any type of now known and/or to be developed wireless communication mechanism by which signals may be communicated between devices, between networks, within a network, and/or the like.

Communications between a computing device and/or a network device and a wireless network may be in accordance with known and/or to be developed communication network protocols including, for example, global system for mobile communications (GSM), enhanced data rate for GSM evolution (EDGE), 802.11b/g/n, and/or worldwide interoperability for microwave access (WiMAX). A computing device and/or a networking device may also have a subscriber identity module (SIM) card, which, for example, may comprise a detachable smart card that is able to store subscription content of a user, and/or is also able to store a contact list of the user. A user may own the computing device and/or networking device or may otherwise be a user, such as a primary user, for example. A computing device may be assigned an address by a wireless network operator, a wired network operator, and/or an Internet Service Provider (ISP). For example, an address may comprise a domestic or international telephone number, an Internet Protocol (IP) address, and/or one or more other identifiers. In other embodiments, a communication network may be embodied as a wired network, wireless network, or any combinations thereof.

A device, such as a computing and/or networking device, may vary in terms of capabilities and/or features. Claimed subject matter is intended to cover a wide range of potential variations. For example, a device may include a numeric keypad and/or other display of limited functionality, such as a monochrome liquid crystal display (LCD) for displaying text, for example. In contrast, however, as another example, a web-enabled device may include a physical and/or a virtual keyboard, mass storage, one or more accelerometers, one or more gyroscopes, global positioning system (GPS) and/or other location-identifying type capability, and/or a display with a higher degree of functionality, such as a touch-sensitive color 2D or 3D display, for example.

A computing and/or network device may include and/or may execute a variety of now known and/or to be developed operating systems, derivatives and/or versions thereof, including personal computer operating systems, such as a Windows, iOS, Linux, a mobile operating system, such as iOS, Android, Windows Mobile, and/or the like. A computing device and/or network device may include and/or may execute a variety of possible applications, such as a client software application enabling communication with other devices, such as communicating one or more messages, such as via protocols suitable for transmission of email, short message service (SMS), and/or multimedia message service (MMS), including via a network, such as a social network including, but not limited to, Facebook, LinkedIn, Twitter, Flickr, and/or Google+, to provide only a few examples. A computing and/or network device may also include and/or execute a software application to communicate content, such as, for example, textual content, multimedia content, and/or the like. A computing and/or network device may also include and/or execute a software application to perform a variety of possible tasks, such as browsing, searching, playing various forms of content, including locally stored and/or streamed video, and/or games such as, but not limited to, fantasy sports leagues. The foregoing is provided merely to illustrate that claimed subject matter is intended to include a wide range of possible features and/or capabilities.

A network may also be extended to another device communicating as part of another network, such as via a virtual private network (VPN). To support a VPN, broadcast domain signal transmissions may be forwarded to the VPN device via another network. For example, a software tunnel may be created between a logical broadcast domain, and a VPN device. Tunneled traffic may, or may not be encrypted, and a tunneling protocol may be substantially compliant with and/or substantially compatible with any now known and/or to be developed versions of any of the following protocols: IPSec, Transport Layer Security, Datagram Transport Layer Security, Microsoft Point-to-Point Encryption, Microsoft's Secure Socket Tunneling Protocol, Multipath Virtual Private Network, Secure Shell VPN, another existing protocol, and/or another protocol that may be developed.

A network may communicate via signal packets and/or frames, such as in a network of participating digital communications. A broadcast domain may be compliant and/or compatible with, but is not limited to, now known and/or to be developed versions of any of the following network protocol stacks: ARCNET, AppleTalk, ATM, Bluetooth, DECnet, Ethernet, FDDI, Frame Relay, HIPPI, IEEE 1394, IEEE 802.11, IEEE-488, Internet Protocol Suite, IPX, Myrinet, OSI Protocol Suite, QsNet, RS-232, SPX, System Network Architecture, Token Ring, USB, and/or X.25. A broadcast domain may employ, for example, TCP/IP, UDP, DECnet, NetBEUI, IPX, Appletalk, other, and/or the like. Versions of the Internet Protocol (IP) may include IPv4, IPv6, other, and/or the like.

Algorithmic descriptions and/or symbolic representations are examples of techniques used by those of ordinary skill in the signal processing and/or related arts to convey the substance of their work to others skilled in the art. An algorithm is here, and generally, is considered to be a self-consistent sequence of operations and/or similar signal processing leading to a desired result. In this context, operations and/or processing involve physical manipulation of physical quantities. Typically, although not necessarily, such quantities may take the form of electrical and/or magnetic signals and/or states capable of being stored, transferred, combined, compared, processed or otherwise manipulated as electronic signals and/or states representing various forms of content, such as signal measurements, text, images, video, audio, etc. It has proven convenient at times, principally for reasons of common usage, to refer to such physical signals and/or physical states as bits, values, elements, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining," "establishing," "obtaining," "identifying," "selecting," "generating," and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically represented as physical electronic and/or magnetic quantities within memories, registers, and/or other storage devices, transmission devices, and/or display devices of the special purpose computer and/or similar special purpose computing and/or network device. In the context of this particular patent application, as mentioned, the term "specific apparatus" may include a general purpose computing and/or network device, such as a general purpose computer, once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change and/or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method of processing content entries, comprising:
    determining equivalent byte values of characters that form the content entries;
    transforming the content entries based, at least in part, on the equivalent byte values of the characters that form the content entries; and
    compressing the transformed content entries.

2. The method of claim 1, wherein the transforming the content entries comprises:
    transforming the content entries into multiple-precision integers.

3. The method of claim 2, wherein the multiple-precision integers are formatted utilizing variable-length code compression.

4. The method of claim 1, wherein determining further comprises:
    obtaining equivalent byte values that accord with a revision of the American Standard Code for Information Interchange (ASCII) for one or more of the characters that form the content entries.

5. The method of claim 4, wherein the equivalent byte values are obtained using a mapping of the one or more of the characters that form the content entries to numbered values.

6. The method of claim 1, wherein the content entries to audio and/or multimedia content segments linked to a user identification parameter.

7. The method of claim 1, wherein transforming the content entries further comprises:
recursively multiplying equivalent byte values for the characters that form the content entries by a base determined, at least in part, from the equivalent byte values.

8. The method of claim 7, wherein the base is determined from the difference between an upper equivalent byte value and a lower equivalent byte value of the determined equivalent byte values of the characters that form the content entries.

9. The method of claim 8, further comprising:
recursively summing the determined equivalent byte values of the characters that form the content entries with previously-summed products of equivalent byte values of the characters that form the content entries and the base.

10. The method of claim 1, further comprising:
decompressing the compressed and transformed content entries via:
determining a quantity of recursive operations to decompress the compressed and transformed content entries to an uncompressed content entry; and
utilizing a modulus operation to determine equivalent byte values based, at least in part, on output signal sample values of the recursive operations.

11. The method of claim 10, wherein the decompressing does not preserve an original order of the content entries.

12. An apparatus comprising:
one or more processors to:
determine equivalent byte values of characters that form content entries;
transform the content entries based, at least in part, on the equivalent byte values of the characters that form the content entries; and
compress the transformed content entries.

13. The apparatus of claim 12, the one or more processors additionally to:
transform the content entries into one or more multiple-precision integers.

14. The apparatus of claim 12, the one or more processors additionally to:
obtain equivalent byte values that accord with a revision of the American Standard Code for Information Interchange (ASCII) for one or more of the characters that form the content entries.

15. The apparatus of claim 12, the one or more processors additionally to:
recursively multiply equivalent byte values for the characters of the content entries by a base to be determined, at least in part, from the equivalent byte values.

16. The apparatus of claim 12, the one or more processors additionally to:
decompress the compressed and transformed content entries via a determination of a quantity of recursion operations to convert the compressed and transformed content entries to an uncompressed content entry and via use of a modulus operation to determine equivalent byte values based, at least in part, on output signal sample values of the recursion operations.

17. An apparatus, comprising:
means for determining equivalent byte values of characters that form the content entries;
means for transforming the content entries based, at least in part, on the equivalent byte values of the characters that form the content entries; and
means for performing compression on the transformed content.

18. The apparatus of claim 17, further comprising:
means for transforming the content entries into multiple-precision integers.

19. The apparatus of claim 17, further comprising:
means for obtaining, from a mapping, equivalent byte values for one or more of the characters that form the content entries.

20. The apparatus of claim 17, further comprising:
means for recursively summing an equivalent byte value with previously-summed products of a plurality of equivalent byte values and a base, the base to be determined from an upper equivalent byte value of the plurality of equivalent byte values and a lower equivalent byte value of the plurality of equivalent byte values.

* * * * *